(12) United States Patent
Rao et al.

(10) Patent No.: US 12,550,357 B2
(45) Date of Patent: Feb. 10, 2026

(54) NITRIDE-BASED SEMICONDUCTOR DEVICE AND METHOD FOR MANUFACTURING THE SAME

(71) Applicant: INNOSCIENCE (SUZHOU) SEMICONDUCTOR CO., LTD., Suzhou (CN)

(72) Inventors: Jian Rao, Suzhou (CN); Jheng-Sheng You, Suzhou (CN); Po-Wei Chen, Suzhou (CN); Ming-Hong Chang, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 812 days.

(21) Appl. No.: 17/635,367

(22) PCT Filed: Dec. 7, 2021

(86) PCT No.: PCT/CN2021/136166
§ 371 (c)(1),
(2) Date: Feb. 14, 2022

(87) PCT Pub. No.: WO2023/102744
PCT Pub. Date: Jun. 15, 2023

(65) Prior Publication Data
US 2023/0343864 A1    Oct. 26, 2023

(51) Int. Cl.
*H10D 30/47*    (2025.01)
*H01L 23/31*    (2006.01)
(Continued)

(52) U.S. Cl.
CPC ....... *H10D 30/475* (2025.01); *H01L 23/3171* (2013.01); *H10D 30/015* (2025.01);
(Continued)

(58) Field of Classification Search
None
See application file for complete search history.

(56) References Cited

U.S. PATENT DOCUMENTS

2015/0021616 A1    1/2015  Lee et al.
2015/0221748 A1*   8/2015  Ostermaier ....... H01L 21/30604
                                                      438/172
(Continued)

FOREIGN PATENT DOCUMENTS

CN    105047707 A      11/2015
CN    112930602 A  *   6/2021   ......... H10D 62/8503

OTHER PUBLICATIONS

International Search Report and Written Opinion of corresponding PCT application No. PCT/CN2021/136166 mailed on Aug. 8, 2022.

*Primary Examiner* — Brent A. Fairbanks
*Assistant Examiner* — Derek L Nielsen
(74) *Attorney, Agent, or Firm* — Li & Cai Intellectual Property (USA) Office

(57) ABSTRACT

A nitride-based semiconductor device includes a first nitride-based semiconductor layer, a second nitride-based semiconductor layer, a nitride-based layer, and a plurality of gate electrodes. The second nitride-based semiconductor layer is disposed on the first nitride-based semiconductor layer and has a bandgap greater than a bandgap of the first nitride-based semiconductor layer. The nitride-based layer is disposed over the second nitride-based semiconductor layer and extends along a first direction to have a strip profile. The gate electrodes are disposed over the nitride-based layer and arranged along the first direction such that at least two of the gate electrodes are separated from each other.

19 Claims, 13 Drawing Sheets

(51) Int. Cl.
    *H10D 30/01*     (2025.01)
    *H10D 62/85*     (2025.01)
    *H10D 64/00*     (2025.01)
    *H10D 64/27*     (2025.01)

(52) U.S. Cl.
    CPC ....... *H10D 62/8503* (2025.01); *H10D 64/112* (2025.01); *H10D 64/411* (2025.01)

(56) References Cited

U.S. PATENT DOCUMENTS

2020/0357907 A1\* 11/2020 Udrea ................. H10D 84/811
2021/0336045 A1\* 10/2021 Oh ....................... H10D 30/675
2022/0209001 A1\*  6/2022 Otake ................. H10D 30/015

\* cited by examiner

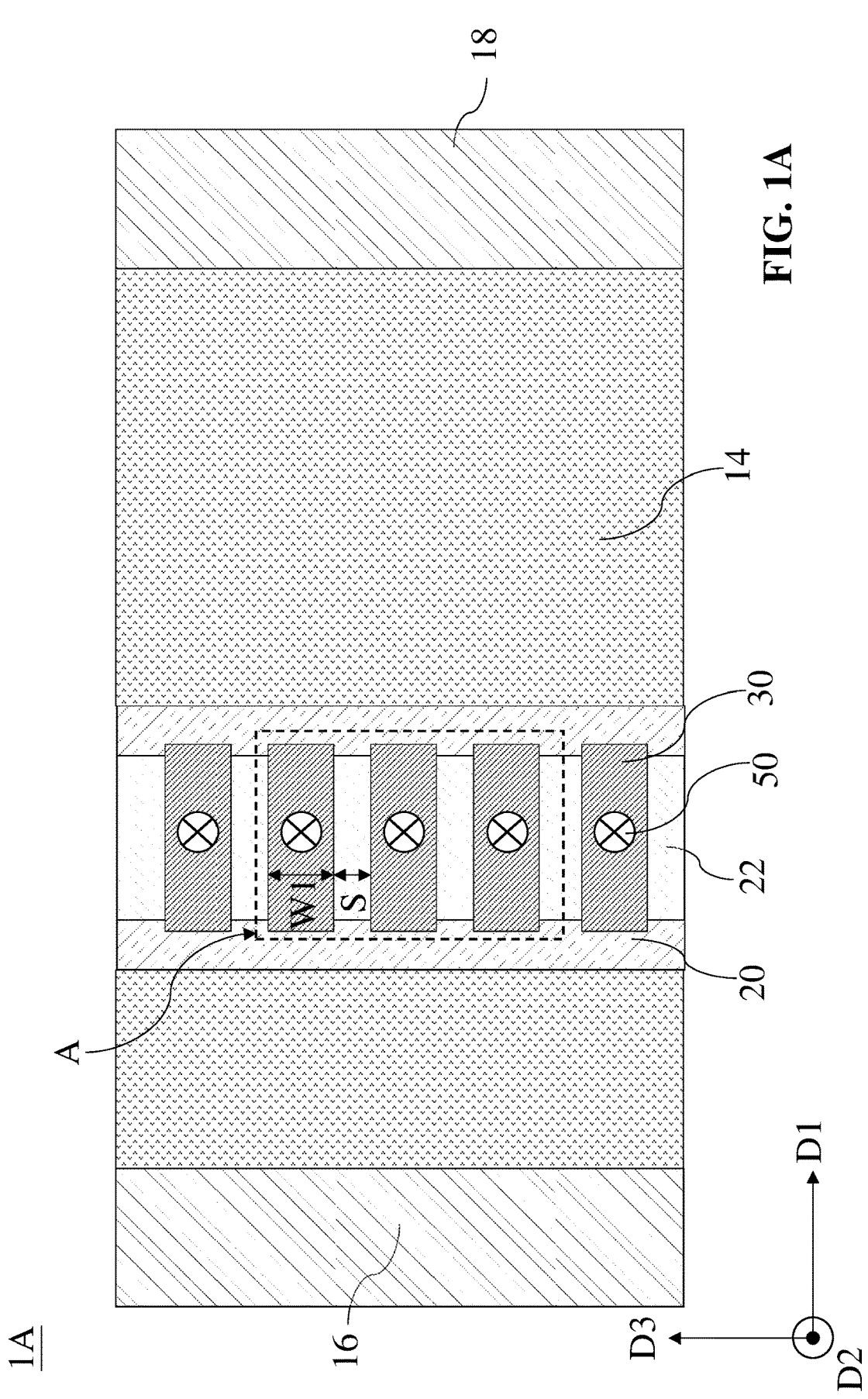

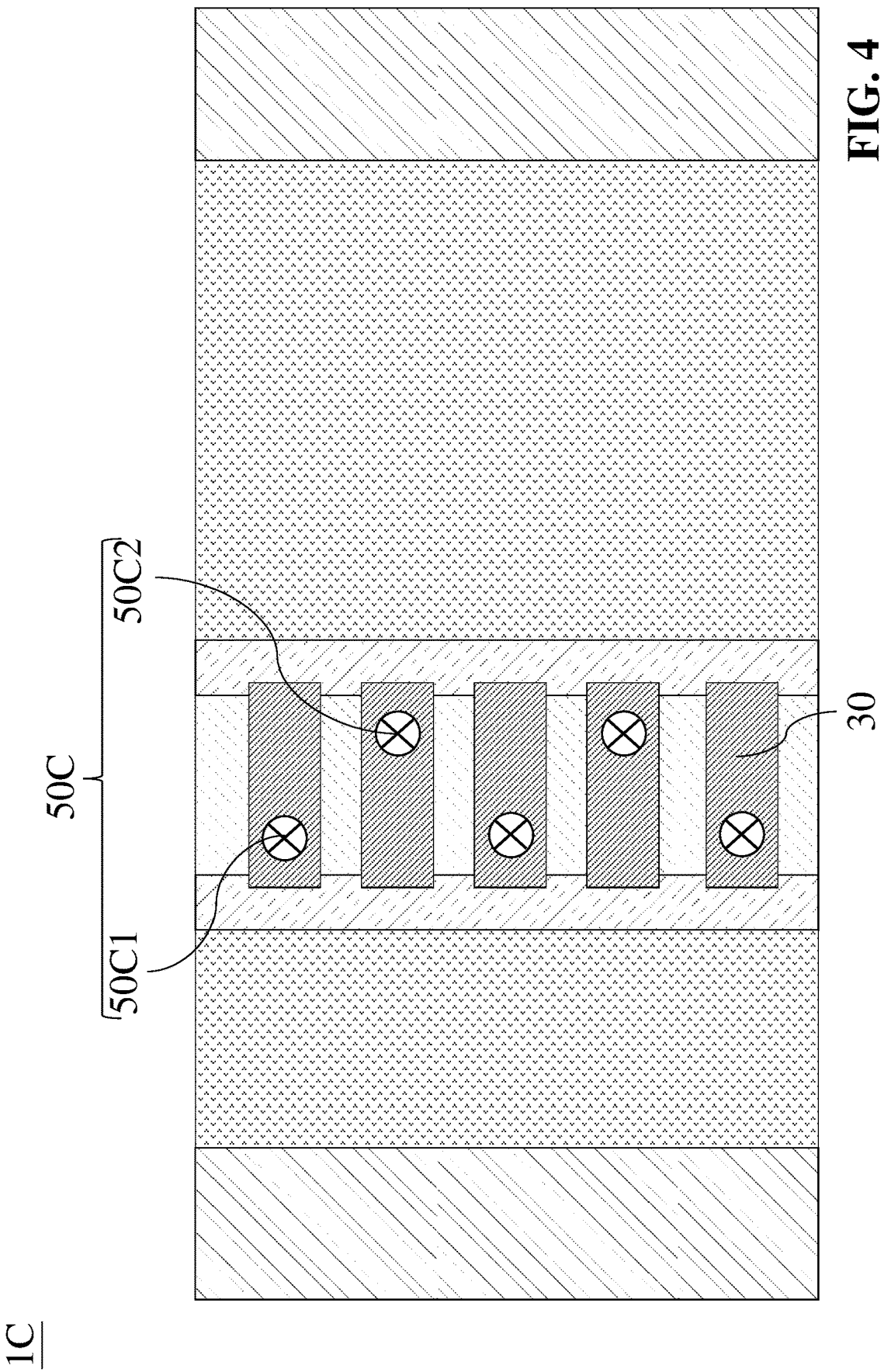

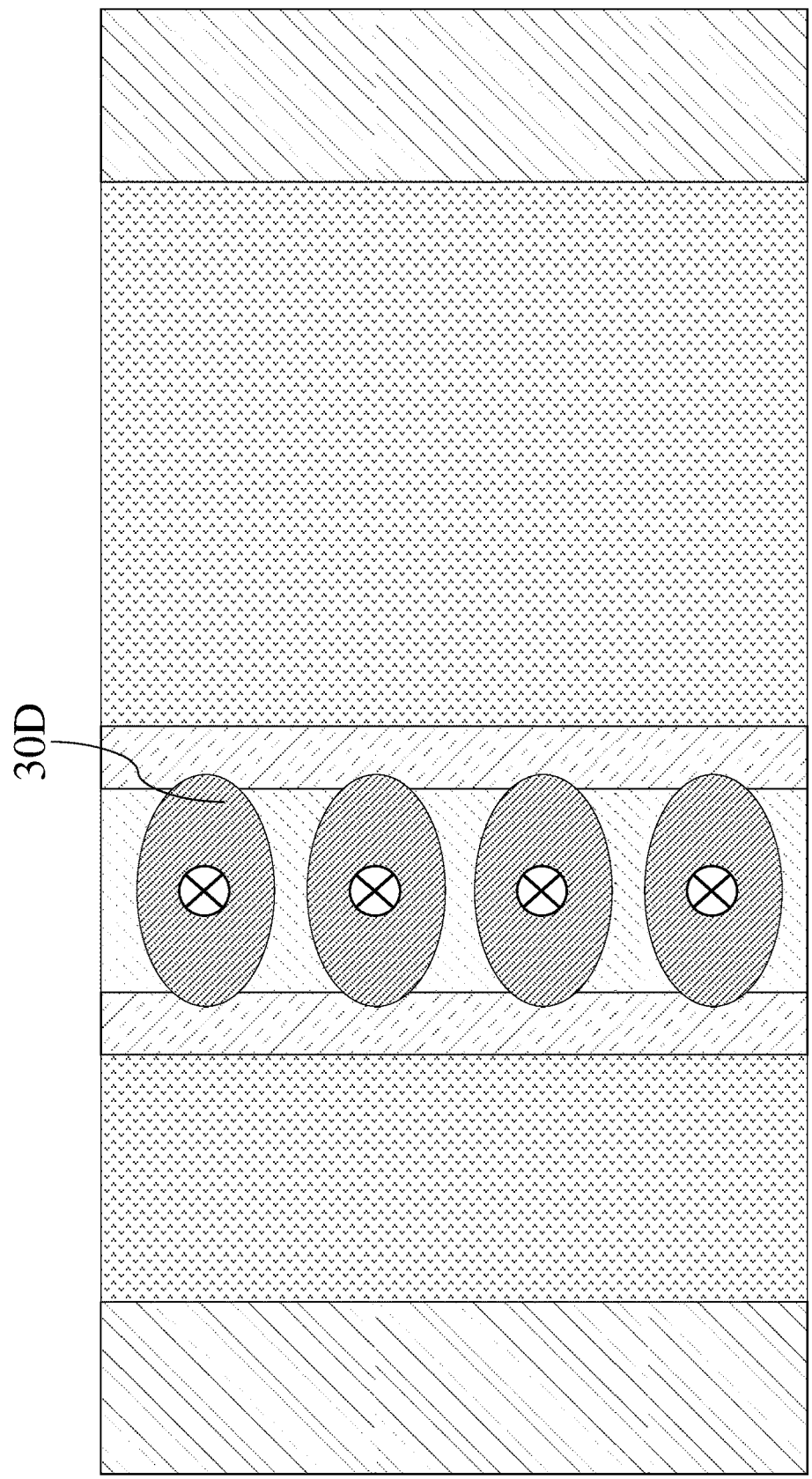

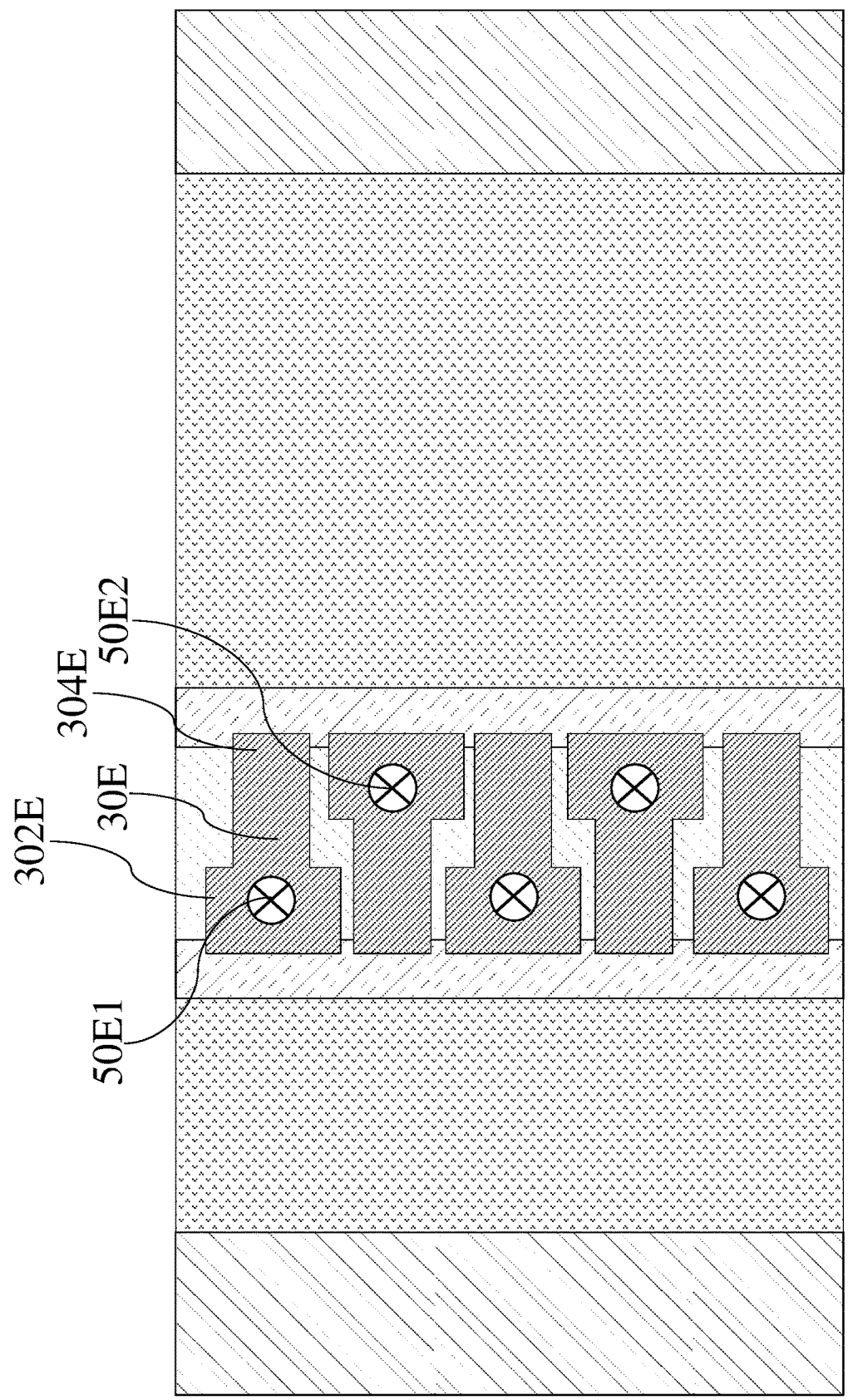

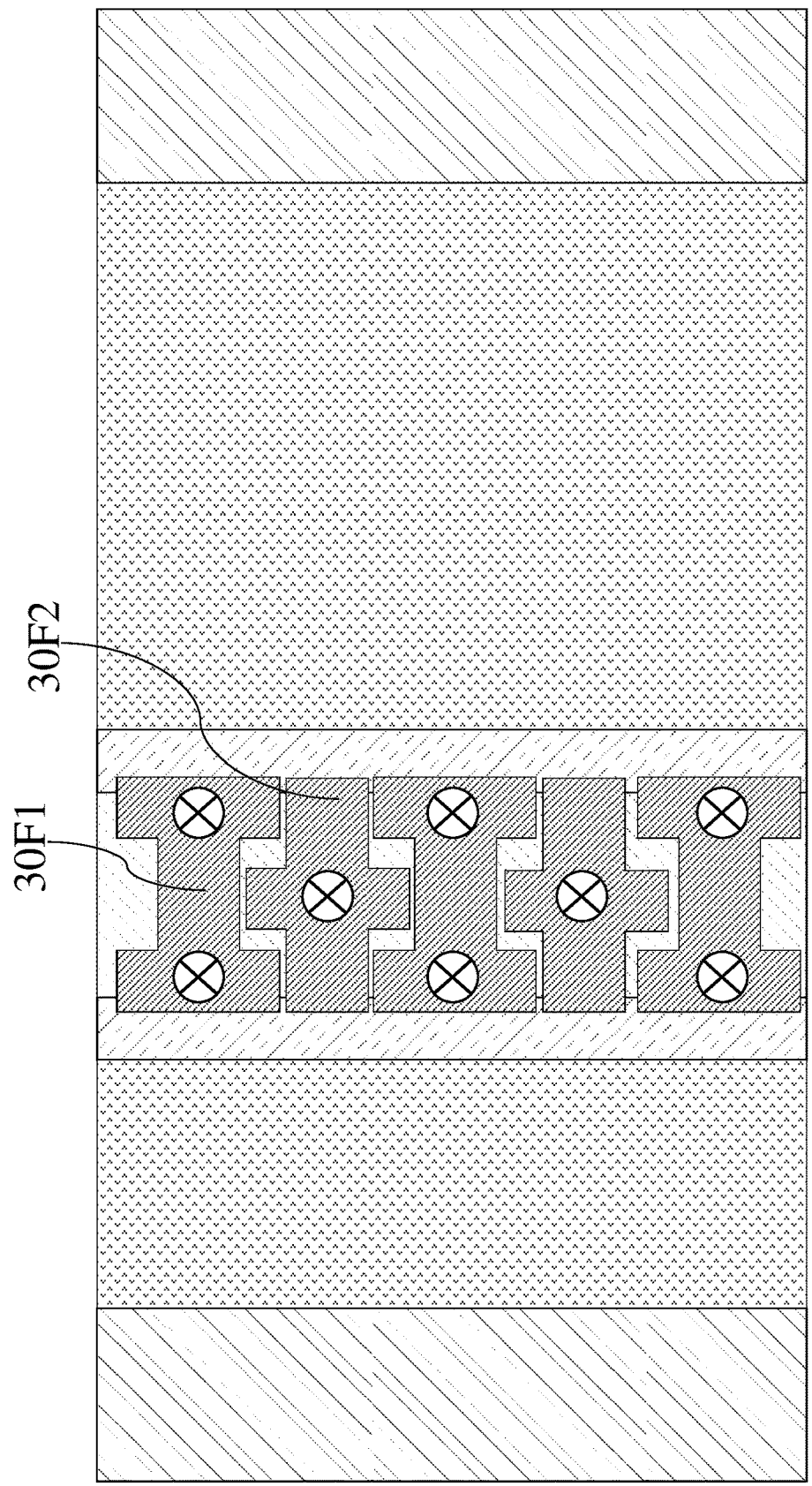

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having separated gate electrodes.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a semiconductor device is provided. A nitride-based semiconductor device includes a first nitride-based semiconductor layer, a second nitride-based semiconductor layer, a first nitride-based layer, and a plurality of gate electrodes. The second nitride-based semiconductor layer is disposed on the first nitride-based semiconductor layer and has a bandgap greater than a bandgap of the first nitride-based semiconductor layer. The first nitride-based layer is disposed over the second nitride-based semiconductor layer and extends along a first direction to have a strip profile. The gate electrodes are disposed over the first nitride-based layer and arranged along the first direction such that at least two of the gate electrodes are separated from each other.

In accordance with one aspect of the present disclosure, a semiconductor device is provided. A semiconductor device includes a first nitride-based semiconductor layer, a second nitride-based semiconductor layer, a first nitride-based layer, a plurality of gate electrodes, a conductive layer, and a plurality of contact vias. The second nitride-based semiconductor layer is disposed on the first nitride-based semiconductor layer and has a bandgap greater than a bandgap of the first nitride-based semiconductor layer. The first nitride-based layer is disposed over the second nitride-based semiconductor. The gate electrodes are disposed over the first nitride-based layer and wider than the first nitride-based layer. The conductive layer is disposed over the gate electrodes. The contact vias respectively connect the gate electrodes to the conductive layer.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A nitride-based layer is formed over the second nitride-based semiconductor layer and extends along a first direction to have a strip profile. A passivation layer is formed over the nitride-based layer and has a plurality of openings to expose the nitride-based layer. A plurality of gate electrodes are formed over the nitride-based layer and arranged along the first direction such that the gate electrodes are in contact with exposed portions of the nitride-based layer.

By the above configuration, in embodiments of the present disclosure, the gate electrodes are separately formed/disposed on the first nitride-based layer instead of a continuous stripe, such that the stress inside the semiconductor device can be relieved. Thus, the reliability of the semiconductor device can be enhanced.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 1A is a top view of a semiconductor device according to some embodiments of the present disclosure;

FIG. 4 is a top view of a semiconductor device according to some embodiments of the present disclosure;

FIG. 5 is a top view of a semiconductor device according to some embodiments of the present disclosure;

FIG. 6 is a top view of a semiconductor device according to some embodiments of the present disclosure; and FIG. 7 is a top view of a semiconductor device according to some embodiments of the present disclosure.

DETAILED DESCRIPTION

Figure 1B:
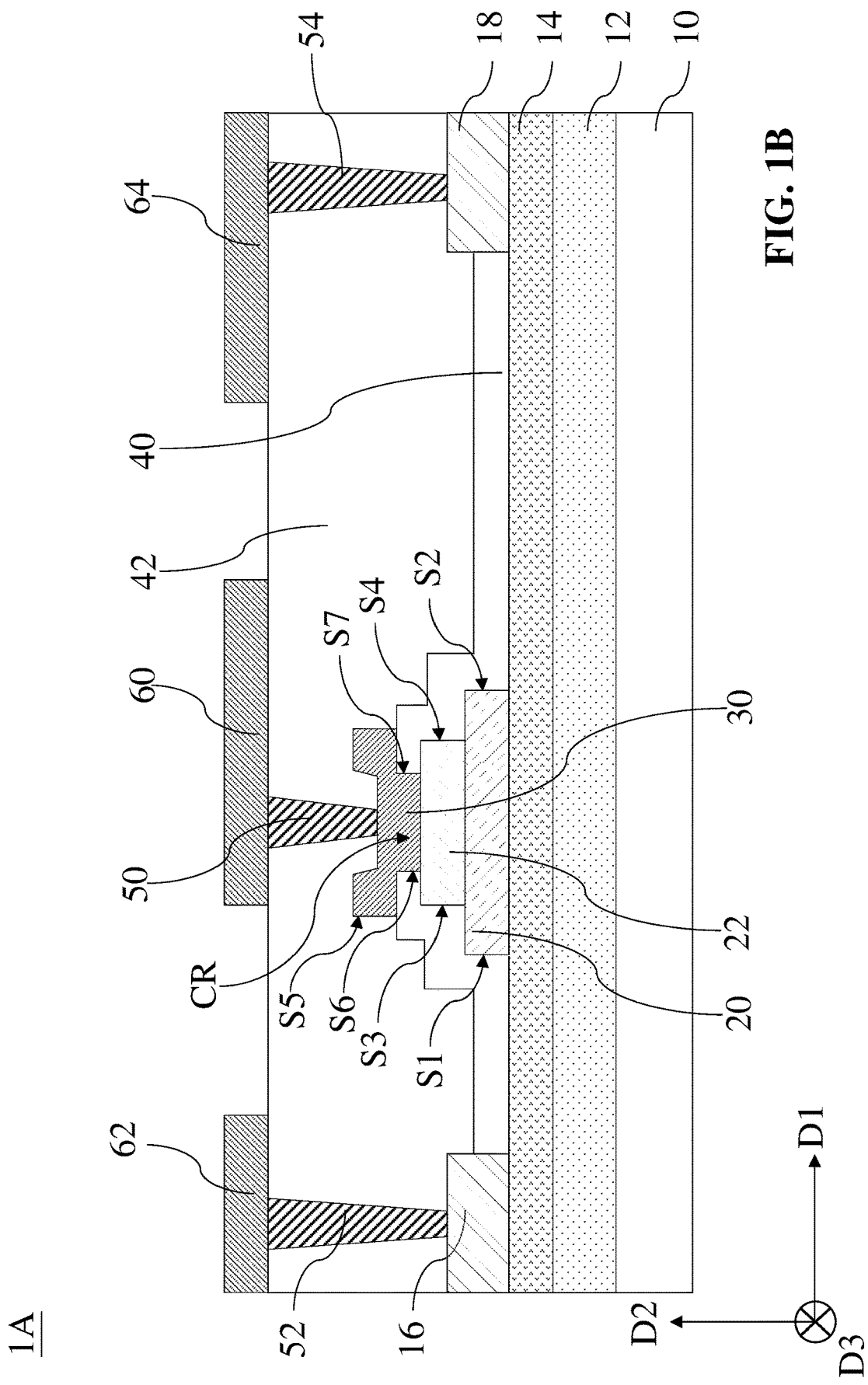
FIG. 1B is a vertical cross-sectional view of the semiconductor device in the FIG. 1A.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a top view of a semiconductor device 1A according to some embodiments of the present disclosure. FIG. 1B is a vertical cross-sectional view of the semiconductor device 1A in the FIG. 1A. The directions D1, D2 and D3 are labeled in the FIGS. 1A and 1B, in which the directions D1, D2 and D3 are different from each other. Any two of the directions D1 to D3 are perpendicular to each other.

The semiconductor device 1A includes a substrate 10, nitride-based semiconductor layers 12, 14, electrodes 16 and 18, nitride-based layers 20, 22, a plurality of gate electrodes 30, passivation layers 40, 42, a plurality of contact vias 50, 52, 54, and patterned conductive layers 60, 62, 64.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

A buffer layer (not shown) can be disposed on/over/above the substrate 10. The buffer layer can be disposed between the substrate 10 and the nitride-based semiconductor layer 12. The buffer layer can be configured to reduce lattice and thermal mismatches between the substrate and the nitride-based semiconductor layer 12, thereby curing defects due to the mismatches/difference. The buffer layer may include a III-V compound. The III-V compound can include, for example but is not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 12 can be disposed on/over/above the substrate 10. The nitride-based semiconductor layer 14 can be disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y\leq1$, $Al_xGa_{(1-x)}N$, where $x\leq1$. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$, where $y\leq1$.

The exemplary materials of the nitride-based semiconductor layers 12 and 14 are selected such that the nitride-based semiconductor layer 14 has a bandgap (i.e., forbidden band width) greater/higher than a bandgap of the nitride-based semiconductor layer 12, which causes electron affinities thereof different from each other and forms a heterojunction therebetween. For example, when the nitride-based semiconductor layer 14 is an AlGaN layer having bandgap of approximately 4.0 eV, the nitride-based semiconductor layer 12 can be selected as an undoped GaN layer having a bandgap of approximately 3.4 eV. As such, the nitride-based semiconductor layers 12 and 14 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The electrodes 16 and 18 can be disposed on/over/above the nitride-based semiconductor layer 14. The electrodes 16 and 18 are directly in contact with the nitride-based semiconductor layer 14. Referring to the FIG. 1A, the electrodes 16 and 18 can extend along the direction D3, such that each of the electrodes 16 and 18 can have a strip profile. In some embodiments, the electrode 16 can serve as a source electrode. In some embodiments, the electrode 16 can serve as a drain electrode. In some embodiments, the electrode 18 can serve as a source electrode. In some embodiments, the electrode 18 can serve as a drain electrode. The role of the electrodes 16 and 18 depends on the device design.

In some embodiments, the electrodes 16 and 18 can include, for example but are not limited to, metals, alloys, doped semiconductor materials (such as doped crystalline silicon), compounds such as silicides and nitrides, other conductor materials, or combinations thereof. The exemplary materials of the electrodes 16 and 18 can include, for example but are not limited to, Ti, AlSi, TiN, or combinations thereof.

Each of the electrodes 16 and 18 may be a single layer, or plural layers of the same or different composition. The electrodes 16 and 18 form ohmic contacts with the nitride-based semiconductor layer 14. Furthermore, the ohmic contacts can be achieved by applying Ti, Al, or other suitable materials to the electrodes 16 and 18. In some embodiments, each of the electrodes 16 and 18 is formed by at least one conformal layer and a conductive filling. The conformal layer can wrap the conductive filling. The exemplary materials of the conformal layer can include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The nitride-based layer 20 is disposed on/over/above the nitride-based semiconductor layer 14. The nitride-based layer 20 is in contact with the nitride-based semiconductor layer 14. The nitride-based layer 22 is disposed on/over/above the nitride-based layer 20. The nitride-based layer 22 is in contact with the nitride-based layer 20. The nitride-based layer 20 is disposed between the nitride-based layer 22 and the nitride-based semiconductor layer 14. Each of the nitride-based layers 20 and 22 extends along the direction D3 to have a strip profile.

The nitride-based layer 22 is narrower than the nitride-based semiconductor layer 20. In some embodiments, a width of the nitride-based layer 20 is substantially the same as a width of the nitride-based layer 22. The profiles of the nitride-based layer 20 and the nitride-based layer 22 are the same, for example, both of them are rectangular profiles. In other embodiments, the profiles of the nitride-based layer 20 and the nitride-based layer 22 can be different from each other. For example, the profile of the nitride-based layer 20 can be a trapezoid profile, the profile of the nitride-based layer 22 can be a rectangular profile.

The nitride-based layer 20 can be a doped nitride-based semiconductor layer. To be more specific, the nitride-based layer 20 can be a p-type doped III-V semiconductor layer. The exemplary materials of the doped p-type doped III-V semiconductor layer can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 12 includes undoped GaN and the nitride-based semiconductor layer 14 includes AlGaN, and the nitride-based layer 20 is a p-type GaN layer which can bend the underlying band structure upwards and to deplete the corresponding zone of the 2DEG region, so as to place the semiconductor device 1A into an off-state condition.

The nitride-based layer 22 can include a metal nitride layer. The exemplary materials of the nitride-based layer 22 can include, for example but are not limited to, titanium nitride (TiN) or tantalum nitride (TaN).

Generally speaking, with respect to a nitride-based semiconductor device, a gate electrode is formed as a continuous stripe on a nitride-based semiconductor layer. Such a shape design of the gate electrode cannot effectively reduce an area thereof, and thus a considerable stress would accumulate in the nitride-based semiconductor device. Therefore, as a part of the striped gate electrode may have stress issue, the stress may transfer to different regions of the semiconductor device along the extending direction of the striped gate electrode, which causes the device failure.

Moreover, a metal field plate is usually formed in the nitride-based semiconductor device for achieving a uniform electric field distribution therein. Due to excess stress, a passivation layer between the stripe-shaped gate electrode and the metal field plate will crack, such that the gate electrode and the metal field plate are highly possible to make contact with each other, thereby causing a short circuit issue. This phenomenon will lead to a deleterious impact on the reliability of the nitride-based semiconductor. In addition, the nitride-based semiconductor device with the stripe-shaped gate electrode is hard to cooperate with the metal field plate due to the afore-said issues; and therefore, the electrical properties thereof are unable effectively promoted.

At least to avoid the afore-mentioned issues, the present disclosure is to provide a novel structure for the nitride-based semiconductor devices.

Referring back to FIG. 1A, by applying a reticle with multiple separated openings during the gate formation, a plurality of gate electrodes can be formed separately on the nitride-based layer 22. Namely, the whole of the separated gate electrodes 30 can be viewed as a gate with an island structure. Specifically, the gate electrodes 30 are formed to be arranged along the direction D3, such that at least two of the gate electrodes are separated from each other. Each of the gate electrodes 30 extends along the direction D1. Two of the adjacent gate electrodes 30 are separated from each other by a spacing S less than widths W1 of the gate electrodes 30. In some embodiments, these spacings S can be equal to each other, which means that these gate electrodes 30 are equally spaced. In some embodiments, these spacings S among the gate electrodes 30 can be different from each other. The spacing S between any two of the adjacent gate electrodes 30 can be determined by device requirements.

The gate electrodes 30 are formed to be disposed on/over/above the nitride-based layer 22. The gate electrodes 30 are formed to be in contact with the nitride-based layer 22, in which the nitride-based layer 22 can serve as a contact layer of the gate electrode 30. The gate electrodes 30 are formed to be arranged along the direction D3. The nitride-based layer 22 is located/sandwiched between the gate electrode 30 and the nitride-based layer 20. The gate electrode 30 is located between the electrodes 16 and 18. The electrode 16 is closer to the gate electrode 30 than the electrode 18. That is, the electrodes 16 and 18 can be arranged as being asymmetrical about the gate electrode 30. In some embodiments, the electrodes 16 and 18 can be arranged as being symmetrical about the gate electrode 30. The arrangement depends on different electrical property requirements.

The passivation layer 40 is disposed on/over/above the nitride-based semiconductor layer 14. The nitride-based layer 20 has two opposite sidewalls S1 and S2. The nitride-based layer 22 has two opposite sidewalls S3 and S4. The passivation layer 40 extends along the sidewalls S1 and S3. The passivation layer 40 extends along the sidewalls S2 and S4.

Each of the gate electrodes 30 has a top and a bottom sidewalls S5 and S6, in which the position of the top sidewall S5 is higher than that of the bottom sidewall S6. The top sidewall S5 is located on/over/above the passivation layer 40. The top sidewall S5 is free from the coverage of the passivation layer 40. The passivation layer 40 surrounds the bottom sidewall S6 of each of the gate electrodes 30.

The passivation layer 40 can continuously extend from the sidewall S1 to the bottom sidewall S6 along the sidewall S3. The passivation layer 40 can continuously extend from the sidewall S2 to the bottom sidewall S6 along the sidewall S4. The passivation layer 40 has a portion to isolate two of the gate electrodes 30 from each other, in which such the portion can act as a buffer portion to relieve the stress. The passivation layer 40 fills a region between any two adjacent gate electrode 30. Such the configuration provides gate discontinuity.

Figure 1C:
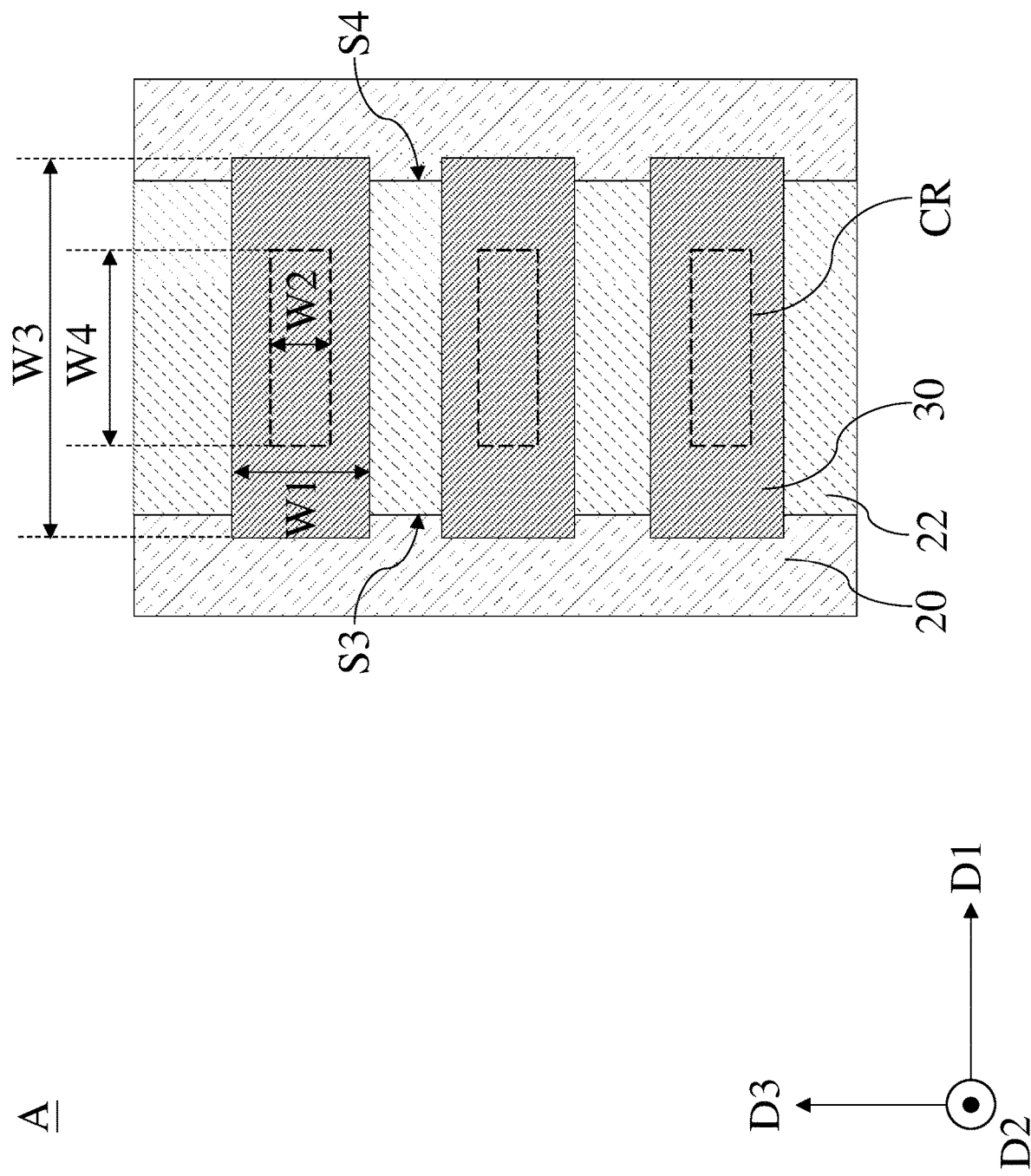
FIG. 1C is a top view of an enlarged region A of the semiconductor device 1A.

FIG. 1C is a top view of an enlarged region A of the semiconductor device 1A. Referring to FIGS. 1B and 1C, the passivation layer 40 has a plurality of enclosed sidewalls S7 to define contact regions CR between the nitride-based layer 22 and the gate electrodes 30. The gate electrodes 30 can penetrate the passivation layer 40 to make contact with the nitride-based layer 22 through the contact regions CR. Each of the gate electrodes 30 has a width W1 along the direction D3 greater than a width W2 of each of the contact regions CR along the direction D3. Each of the gate electrodes 30 has a width W3 along the direction D1 greater than a width W4 of each of the contact regions CR along the direction D1. An orthogonal/vertical projection of each of the contact regions CR on the nitride-based semiconductor layer 14 falls in a range of an orthogonal/vertical projection of corresponding the gate electrodes 30 on the nitride-based semiconductor layer 14. Since the passivation layer 40 fills a region between any two adjacent gate electrode 30, the passivation layer 40 can extend from the sidewall S3 to the sidewall S4 of the nitride-based layer 22.

As compared with a semiconductor device with the striped gate electrode, the configuration of the separated gate electrodes 30 can reduce the accumulation of the stress. Moreover, even though some of the gate electrodes 30 may have stress issues, the stress is hard to transfer to other regions of the semiconductor device 1A due to gate discontinuity (i.e., the transferring path of the stress is cut). In other words, the transferring path of the stress is truncated by the gate discontinuity, and these mechanically stressed gate electrodes 30 laterally terminate at the passivation layer 40. The negative impact caused by the stress would be restricted. Thus, the reliability of the semiconductor device 1A can be enhanced.

Referring back to FIG. 1B, the electrodes 16 and 18 penetrate the passivation layer 40 to make contact with the nitride-based semiconductor layer 14. The gate electrodes 30 can penetrate the passivation layer 40 to make contact with the nitride-based layer 22.

The exemplary materials of the gate electrodes 30 may include metals or metal compounds. The gate electrode 30 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Cu, Al, metal alloys or compounds thereof, or other metallic compounds.

The material of the passivation layer 40 can include, for example but are not limited to, dielectric materials. For example, the passivation layer 40 can include, for example but are not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the passivation layer 40 can be a multi-layered structure, such as a composite dielectric layer of $Al_2O_3/SiN$, $Al_2O_3/SiO_2$, AlN/SiN, AlN/SiO_2, or combinations thereof.

In the exemplary illustration of FIG. 1B, the semiconductor device 1A is an enhancement mode device, which is in a normally-off state when the gate electrode 30 is at approximately zero bias. Specifically, the nitride-based layer 20 (i.e., the doped nitride-based semiconductor layer) may create at least one p-n junction with the nitride-based semiconductor layer 14 to deplete the 2DEG region, such that at least one zone of the 2DEG region corresponding to a position below the corresponding the gate electrode 30 has different characteristics (e.g., different electron concentrations) than the rest of the 2DEG region and thus is blocked.

Due to such mechanism, the semiconductor device 1A has a normally-off characteristic. In other words, when no voltage is applied to the gate electrodes 30 or a voltage applied to the gate electrodes 30 is less than a threshold voltage (i.e., a minimum voltage required to form an inversion layer below the gate electrode 30), the zones of the 2DEG region below the gate electrodes 30 are kept blocked, and thus no current flows therethrough.

The passivation layer 42 is disposed on/over/above the electrodes 16, 18, the gate electrode 30 and the passivation layer 40. The material of the passivation layer 42 can be identical with or similar with that of the passivation layer 40.

The contact vias 50, 52, and 54 are disposed within the passivation layer 42. The contact vias 50, 52, and 54 can penetrate the passivation layer 42. The contact vias 50, 52, and 54 can extend longitudinally to connect to the gate electrode 30, the electrodes 16 and 18 respectively. The contact via 50 can extend upward from the gate electrode 30. The upper surfaces of the contact vias 50, 52, and 54 are free from coverage of the passivation layer 40. The exemplary materials of the contact vias 50, 52 and 54 can include, for example but are not limited to, conductive materials, such as metals or alloys.

In the exemplary illustration of FIG. 1B, since there are multiple gate electrodes 30 introduced into the structure, the contact vias 50 are respectively connected to the gate electrodes 30. The contact vias 50 can be arranged along the direction D3.

Referring back to FIG. 1B, the patterned conductive layers 60, 62 and 64 are disposed on/over/above the passivation layer 42 and the contact vias 50, 52 and 54. The patterned conductive layer 60 is in contact with the contact vias 50. The patterned conductive layer 62 is in contact with the contact vias 52. The patterned conductive layer 64 is in contact with the contact vias 54. Each of the patterned conductive layers 60, 62 and 64 may have metal lines, pads, traces, or combinations thereof, such that each of the patterned conductive layers 60, 62 and 64 can form at least one circuit. Hence, each of the patterned conductive layers 60, 62 and 64 can serve as a patterned circuit layer.

As afore-mentioned, there are multiple contact vias 50 introduced into the structure, these contact vias 50 can be connected to the patterned conductive layer 60, so as to electrically couple the gate electrode 30 with the patterned conductive layer 60 through the contact vias 50. The patterned conductive layer 62 can be connected with the electrode 18 by the contact vias 54. The patterned conductive layer 64 can be connected with the electrode 16 by the contact vias 52.

An external electronic device can send at least one electronic signal to the semiconductor device 1A by the patterned conductive layers 60 62 and 64, and vice versa. Since the gate electrodes 30 are connected to the same patterned conductive layer 60 through the conductive vias 50, the voltage levels of the gate electrodes 30 can be the same.

The exemplary materials of the patterned conductive layers 60, 62 and 64 can include, for example but are not limited to, conductive materials. Each of the patterned conductive layers 60, 62 and 64 may include a single film or multilayered film having Ag, Al, Cu, Mo, Ni, Ti, alloys thereof, oxides thereof, nitrides thereof, or combinations thereof.

Different stages of a method for manufacturing the semiconductor device 1A are shown in FIG. 2A, FIG. 2B, FIG. 2C, FIG. 2D, FIG. 2E, FIG. 2F, FIG. 2G, FIG. 2H, FIG. 2I, and FIG. 2J, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
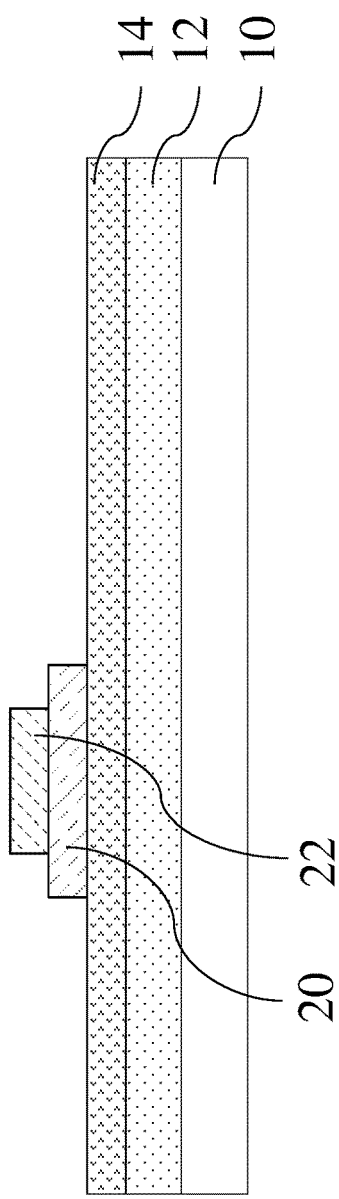
FIG. 2A, FIG. 2B, FIG. 2C, FIG. 2D, FIG. 2E, FIG. 2F, FIG. 2G, FIG. 2H, FIG. 2I, and FIG. 2J show different stages of a method for manufacturing a nitride-based semiconductor device according to some embodiments of the present disclosure.
Figure 2B:
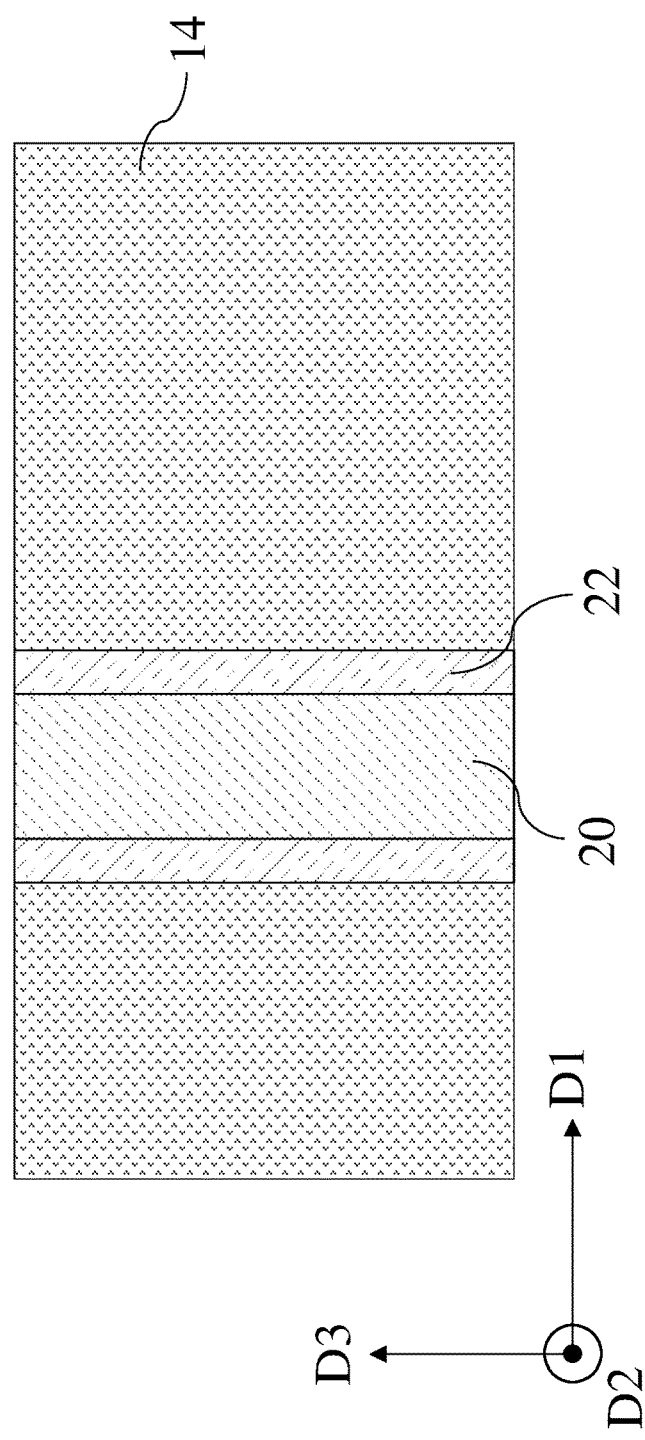

Referring to FIGS. 2A and 2B, which are a cross sectional view and a top view of the same stage, respectively, a nitride-based semiconductor layer 12 is formed on/over/ above a substrate 10 by using deposition techniques. A nitride-based semiconductor layer 14 is formed on the nitride-based semiconductor layer 12 by using deposition techniques, so that a heterojunction is formed therebetween. A nitride-based layer 20 can be formed on the nitride-based semiconductor layer 14. A nitride-based layer 22 can be formed on the nitride-based layer 20. Each of the nitride-based layers 20 and 22 extends along the direction D3 to have a strip profile, and the nitride-based layer 20 is formed to be wider than the nitride-based layer 22.

The formation of the nitride-based layers 20 and 22 includes deposition techniques and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof.

Figure 2C:
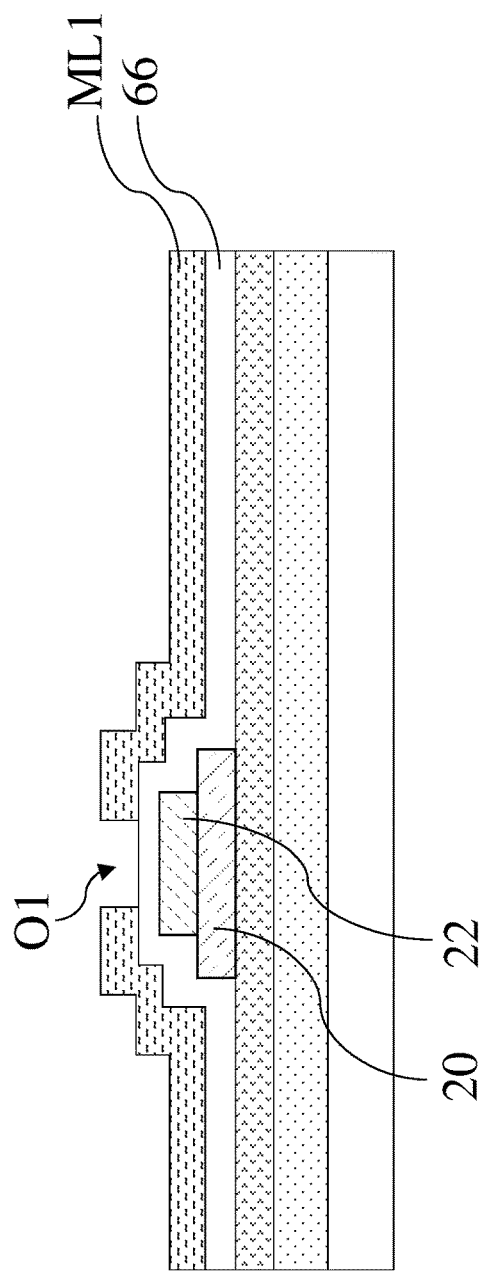
Figure 2D:
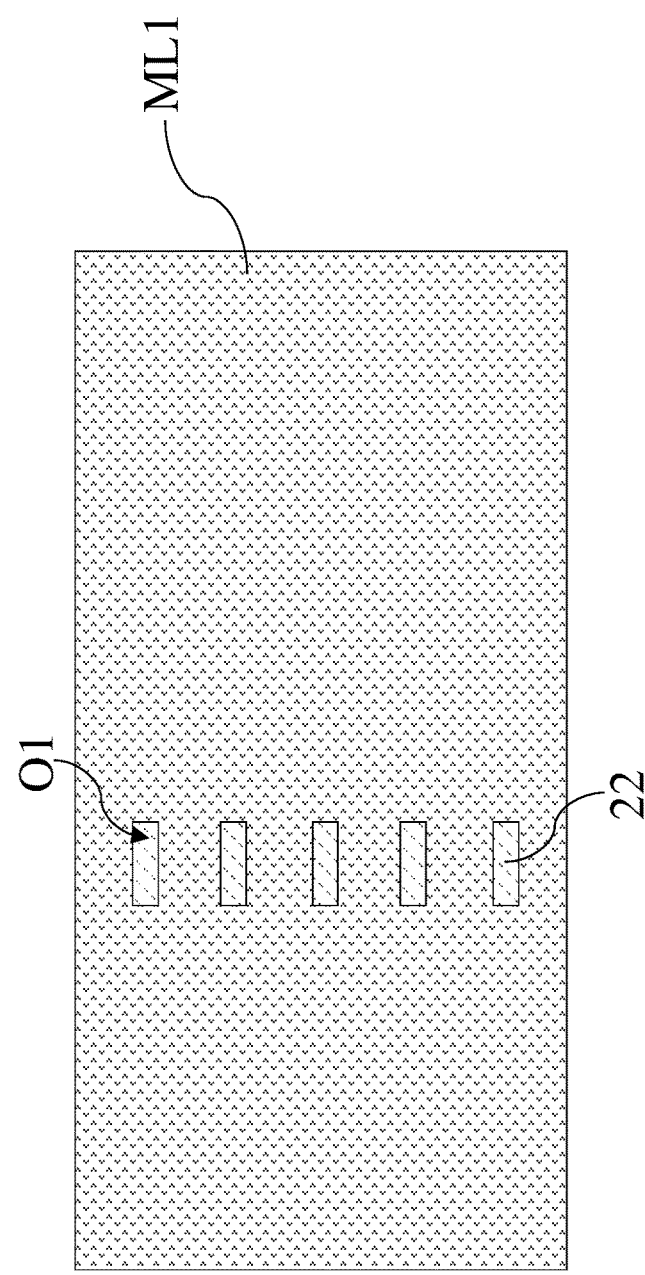

Referring to FIGS. 2C and 2D, which are a cross sectional view and a top view of the same stage, respectively, a blanket passivation layer 66 is formed on/over/above and covers the nitride-based layers 20 and 22, so as to form a protruding portion. A mask layer ML1 is formed on/over/above the blanket passivation layer 66 with a plurality of separated openings O1.

Figure 2E:
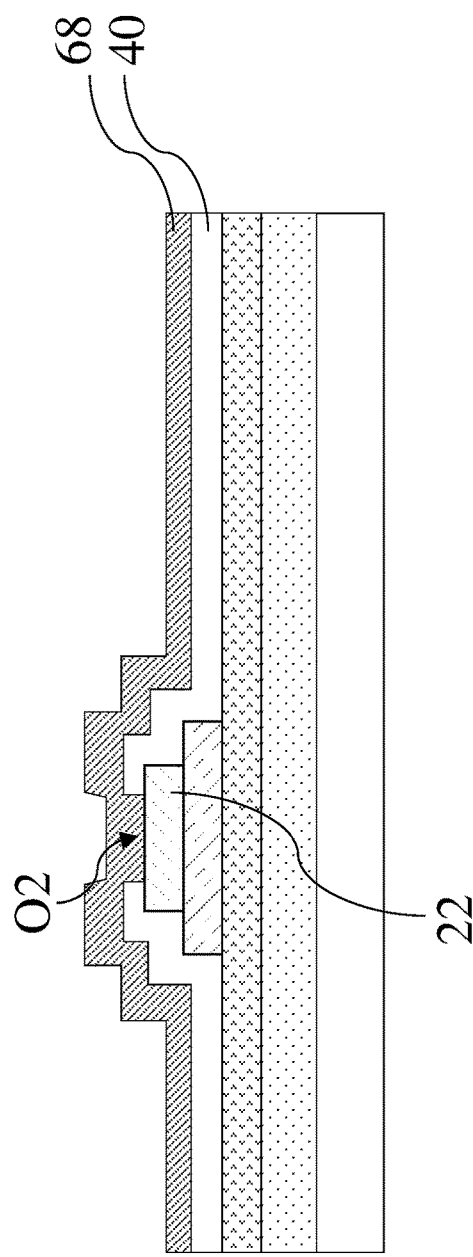
Figure 2F:
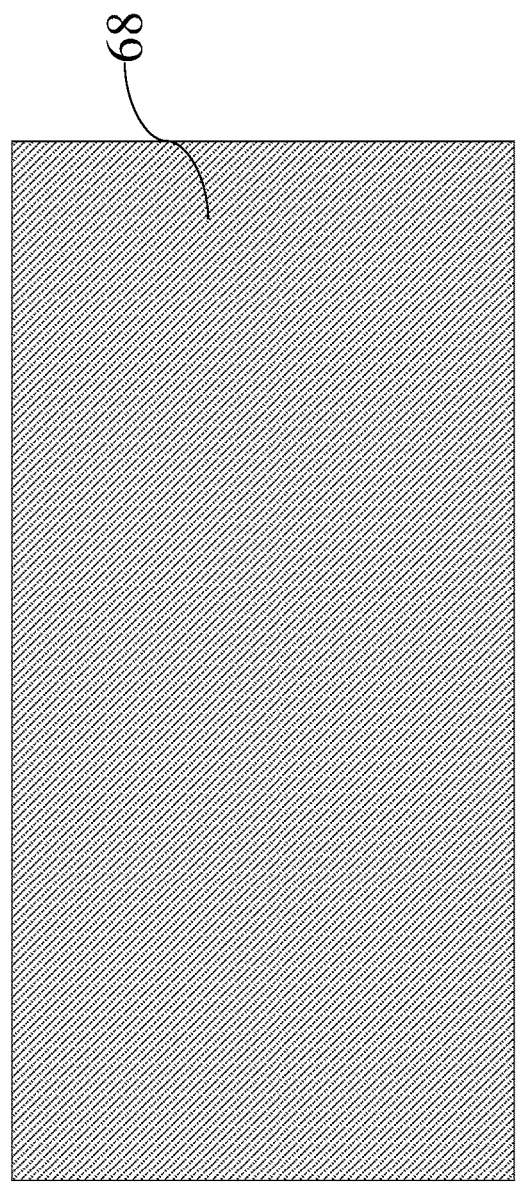

Referring to FIGS. 2E and 2F, which are a cross sectional view and a top view of the same stage, respectively, a patterning process is performed on the blanket passivation layer 66 with the mask layer ML1 to remove some portions of the blanket passivation layer 66, such that a passivation layer 40 with a plurality of openings O2 can be formed. The openings O2 of the passivation layer 40 expose the nitride-based layer 22. Then, a blanket conductive layer 68 is formed on/over/above the passivation layer 40 and the nitride-based layer 22 to fill these openings O2, such that the blanket conductive layer 68 can be in contact with the nitride-based layer 22.

Figure 2G:
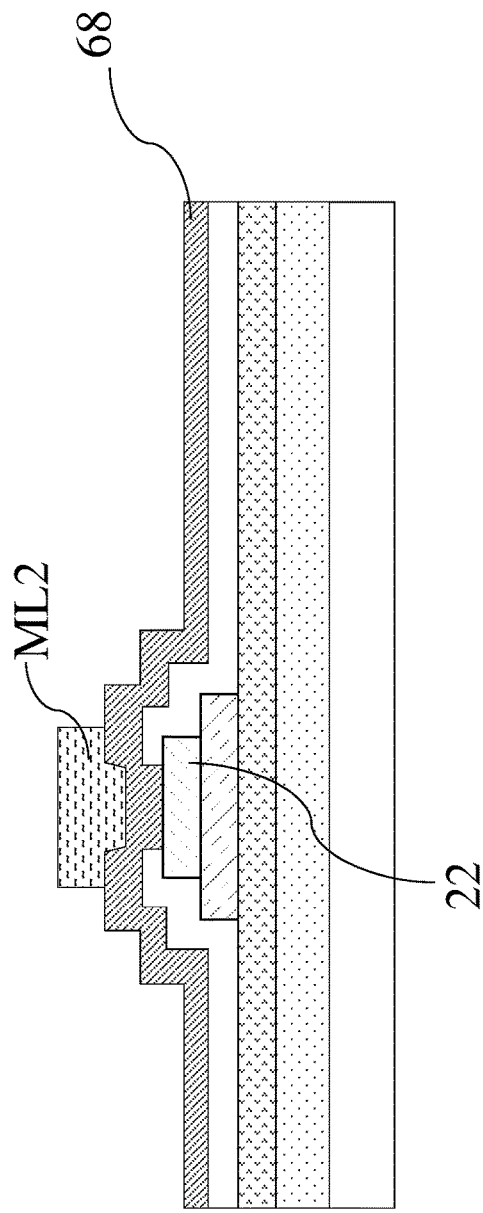
Figure 2H:
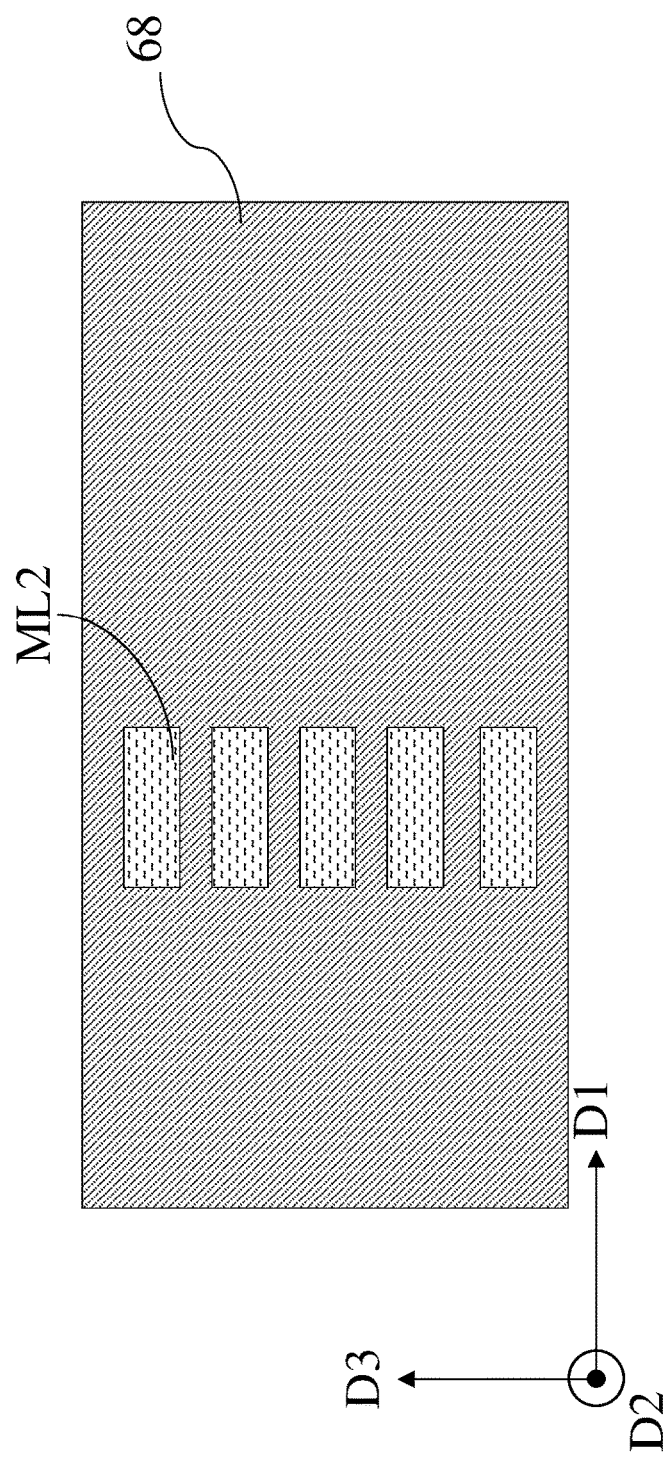

Referring to FIGS. 2G and 2H, which are a cross sectional view and a top view of the same stage, respectively, a plurality of separated mask layers ML2 are formed on/over/above the blanket conductive layer 68, in which the mask layers ML2 are formed to be arranged along the direction D3.

Figure 2I:
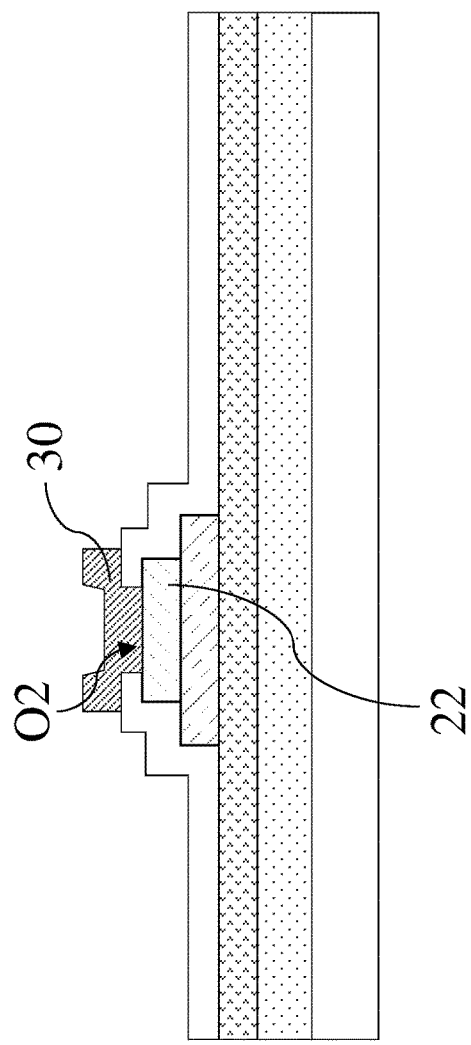
Figure 2J:
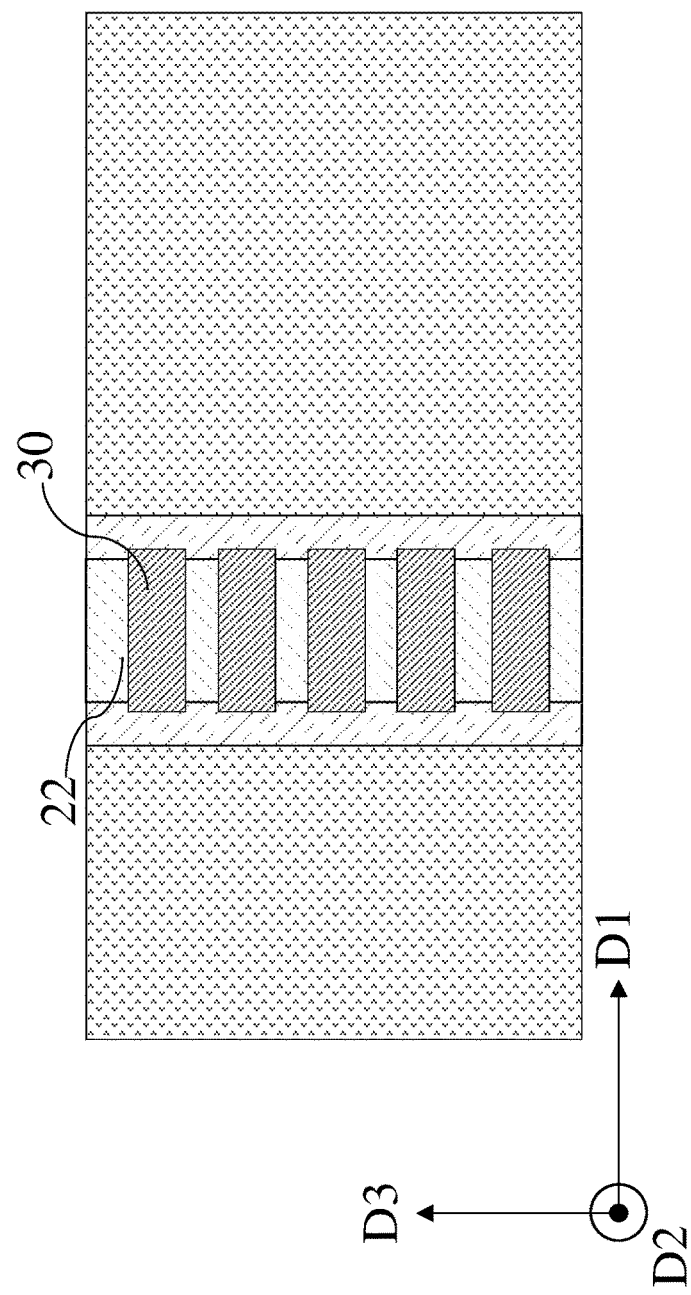

Referring to FIGS. 2I and 2J, which are a cross sectional view and a top view of the same stage, respectively, a patterning process is performed on the blanket conductive layer 68 with the mask layers ML2 to remove some portions of the blanket conductive layer 68. After that, a plurality of separated gate electrodes 30 can be formed on/over/above the nitride-based layer 22 and arranged along the direction D3

The gate electrodes 30 can be in contact with the exposed portions of the nitride-based layer 22. The gate electrodes 30 can be formed to be separated from each other. The gate electrodes 30 are formed to fill with the openings O2, respectively. The gate electrodes 30 extend from the openings O2 to the outside of the openings O2. Thereafter, the passivation layer 42, the contact vias 50, 52 and 54, and the patterned conductive layers 60, 62 and 64 can be formed, obtaining the configuration of the semiconductor device 1A as shown in FIG. 1B.

Figure 3:
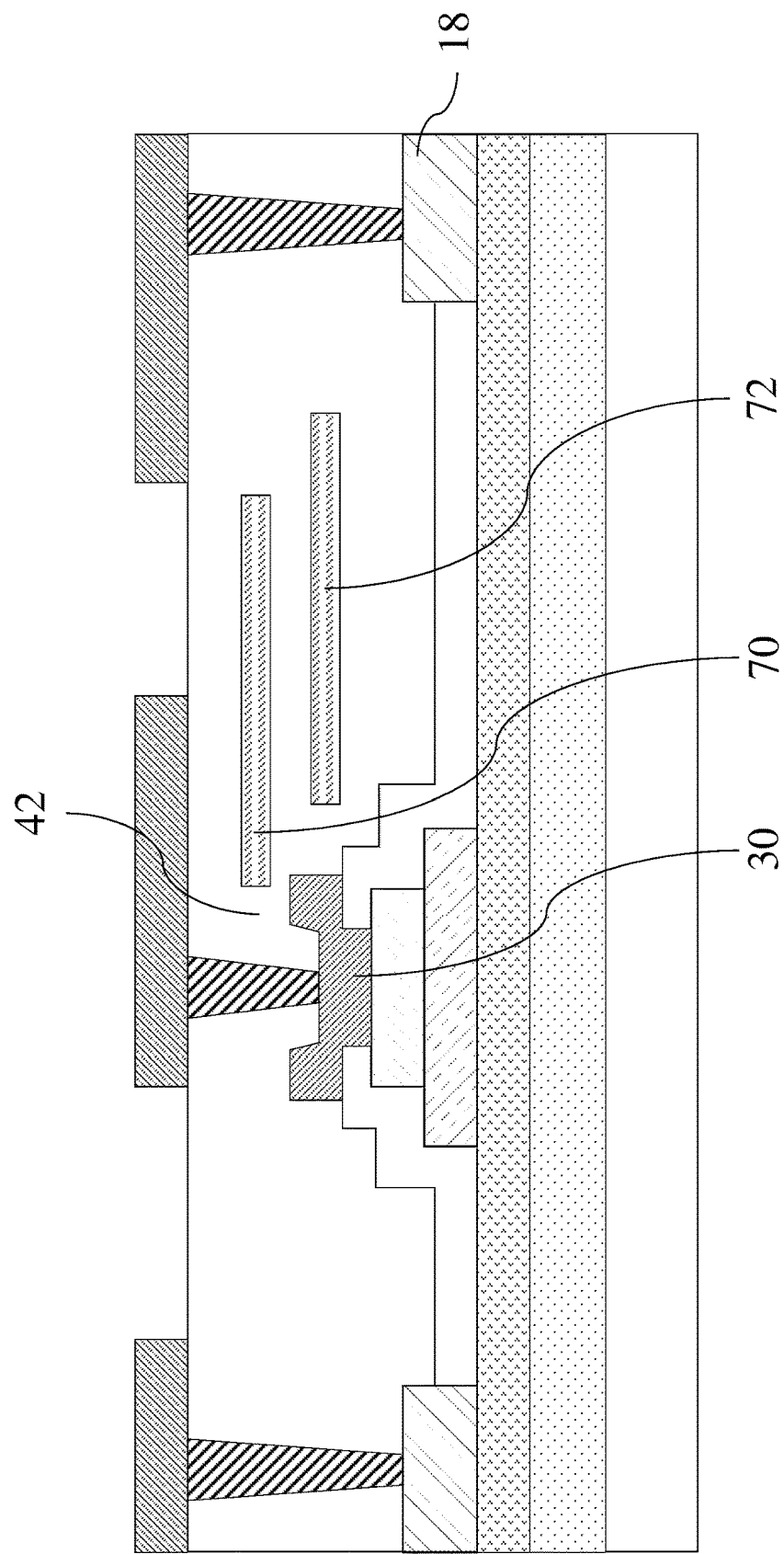
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIGS. 1A, 1B and 1C, except that the semiconductor device 1B further includes a plurality of field plates 70 and 72. The field plates 70 and 72 are embedded/disposed in the passivation layer 42. The field plates 70 and 72 are disposed between the gate electrode 30 and the electrode 18. The field plate 70 is disposed over the gate electrodes 30. The field plate 70 vertically overlaps with the gate electrodes 30 and the field plate 72. The exemplary materials of the field plates 70 and 72 can include, for example but are not limited to, conductive materials, such as Ti, Ta, TiN, TaN, or combinations thereof. Thus, the field plates 70 and 72 can be regarded as conductive layers. In some embodiments, other conductive materials such as Al, Cu doped S1, and alloys including these materials may also be used.

The configuration of the field plates 70 and 72 can split the electric field into more peaks so as to achieve a more uniform electric field distribution. Moreover, due to configuration of the separated gate electrodes 30, the stress in the semiconductor device 1B can be reduced. Thus, the stress is less likely to affect the quality of the passivation layer 42 between the gate electrodes 30 and the field plate 70/72, thereby avoiding short circuit issue. Therefore, the semiconductor device 1B with separated gate electrodes 30 can operate with the field plates 70 and 72 smoothly.

FIG. 4 is a top view of a semiconductor device 1C according to some embodiments of the present disclosure. The semiconductor device 1C is similar to the semiconductor device 1A as described and illustrated with reference to FIGS. 1A, 1B and 1C, except that the contact vias 50 of FIG. 1C are replaced by contact vias 50C. The contact vias 50C can be classified into two groups, a group of contact vias 50C1 and another group of contact vias 50C2. Specifically, the group of the contact vias 50C1 are closer to left sidewalls of the gate electrodes 30 than right sidewalls of the gate electrodes 30, and the group of the contact vias 50C2 are closer to right sidewalls of the gate electrodes 30 than left sidewalls of the gate electrodes 30. The group of the contact vias 50C1 is vertically misaligned with the group of the contact vias 50C2. Such a configuration can increase the average distance between the contact vias 50C1 and 50C2, thereby decreasing the parasitic/stray capacitances among the contact vias 50C1 and 50C2. Therefore, the semiconductor device 1C can have excellent high frequency characteristics.

FIG. 5 is a top view of a semiconductor device 1D according to some embodiments of the present disclosure. The semiconductor device 1D is similar to the semiconductor device 1A as described and illustrated with reference to FIGS. 1A, 1B and 1C, except that the gate electrodes 30 of FIG. 1A are replaced by gate electrodes 30D. The gate electrodes 30D are arranged along a direction. Each of the gate electrodes 30D is in a curved shape. The curved shape can include ellipse, circle, or combinations thereof.

FIG. 6 is a top view of a semiconductor device 1D according to some embodiments of the present disclosure. The semiconductor device 1E is similar to the semiconductor device 1A as described and illustrated with reference to FIGS. 1A, 1B and 1C, except that the gate electrodes 30 of FIG. 1A are replaced by gate electrodes 30E. The gate electrodes 30E are arranged along a direction. Each of the gate electrodes 30E is in a hammer shape. Each of the gate electrodes 30E has a head portion 302E and a body portion 304E connected to each other.

The arrangement of the gate electrodes 30E is alternately. For example, the first one of the gate electrodes 30E has a head portion 302E at the left side, and the second one of the gate electrodes 30E has a head portion 302E at the right side. Such the arrangement is to make the alignment of contact vias 50E1 and 50E2 more accurate with the gate electrodes 30E. The contact vias 50E1 and 50E2 can be connected to the gate electrodes 30E at their head portions 302E. Since the head portions 302E can have a larger area than those of the body portions 304E, the landing of the contact vias 50E1 and 50E2 can be controlled to be located within the boundary of the head portions 302E.

FIG. 7 is a top view of a semiconductor device 1F according to some embodiments of the present disclosure. The semiconductor device 1F is similar to the semiconductor device 1A as described and illustrated with reference to FIGS. 1A, 1B and 1C, except that the gate electrodes 30 of FIG. 1A are replaced by gate electrodes 30F1 and 30F2. The gate electrodes 30F1 and 30F2 are arranged along a direction. The gate electrodes 30F1 and 30F2 have profiles corresponding with each other.

The arrangement of the gate electrodes 30F1 and 30F2 has high space utilization. Since gate electrodes can serve as one factor for switching on a device, the device will have a low on-off ratio once a control area defining by the ate electrodes is too small, which make the device hard to switch one. Herein, the phrase "gate electrodes 30F1 and 30F2 having profiles corresponding with each other" means that the gate electrodes 30F1 and 30F2 can be formed to have shapes matching each other. For example, the gate electrode 30F1 can have a concave at its bottom and the gate electrode 30F2 can have a projection at its top. The projection can insert into the concave so the concave encloses the projection. As such, the space utilization can be improved.

Based on the above description, in embodiments of the present disclosure, the gate of the semiconductor device can be formed to have an island structure, and thus the total area of the gate can be reduced, thereby reducing the stress generated in the gate. As such, the semiconductor device can have a good reliability and a good yield rate. In addition, the semiconductor device can operate with at least one field plate smoothly, and thus the electrical properties thereof can be further improved.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer;
a first nitride-based layer disposed over the second nitride-based semiconductor layer and extending along a first direction to have a strip profile, wherein the first nitride-based layer is a p-type doped nitride-based semiconductor layer;
a plurality of gate electrodes disposed over the first nitride-based layer and arranged along the first direction such that at least two of the gate electrodes are separated from each other; and
a passivation layer disposed over the second nitride-based semiconductor layer and extending along a sidewall of the first nitride-based layer, wherein the passivation layer has a portion to isolate two of the gate electrodes from each other, and the portion fills a region between the two gate electrodes and is located over a top surface of the first nitride-based layer.

2. The semiconductor device of claim 1, wherein the passivation layer has a plurality of enclosed sidewalls to define contact regions between the first nitride-based layer and the gate electrode.

3. The semiconductor device of claim 2, wherein each of the gate electrodes has a width greater than a width of each of the contact regions along the first direction.

4. The semiconductor device of claim 2, wherein each of the gate electrodes has a width greater than a width of each of the contact regions along a second direction different than the first direction.

5. The semiconductor device of claim 1,
wherein the passivation layer extends along a first sidewall to a second sidewall of the first nitride-based layer, and wherein the passivation layer surrounds a bottom sidewall of each of the gate electrodes.

6. The semiconductor device of claim 5, wherein each of the gate electrodes has a top sidewall located over the passivation layer.

7. The semiconductor device of claim 1, further comprising:
a plurality of contact vias extending upward from the gate electrodes, respectively.

8. The semiconductor device of claim 7, wherein a first group of the contact vias are closer to first sidewalls of the gate electrodes than second sidewalls of the gate electrodes.

9. The semiconductor device of claim 8, wherein a second group of the contact vias are closer to the second sidewalls of the gate electrodes than the first sidewalls of the gate electrodes.

10. The semiconductor device of claim 1, wherein two of the adjacent gate electrodes are separated from each other by a spacing less than widths of the gate electrodes.

11. The semiconductor device of claim 1, further comprising:
a field plate disposed over the gate electrodes and vertically overlapping with the gate electrodes.

12. The semiconductor device of claim 1, further comprising:
a second nitride-based layer disposed over the first nitride-based layer and extending along the first direction to have a strip profile, wherein the gate electrodes are located above the second nitride-based layer.

13. The semiconductor device of claim 12, wherein the second nitride-based layer is narrower than the first nitride-based layer and the gate electrodes.

14. The semiconductor device of claim 13, wherein the first nitride-based layer comprises p-type GaN, and the second nitride-based layer comprises TiN.

15. A method for manufacturing the semiconductor device of claim 1, comprising:
forming a first nitride-based semiconductor layer over a substrate;
forming a second nitride-based semiconductor layer on the first nitride-based semiconductor layer;
forming a first nitride-based layer over the second nitride-based semiconductor layer and extending along a first direction to have a strip profile, wherein the first nitride-based layer is a p-type doped nitride-based semiconductor layer; and
forming a passivation layer over the first nitride-based layer and having a plurality of openings to expose the first nitride-based layer; and
forming a plurality of gate electrodes over the first nitride-based layer and arranged along the first direction such that the gate electrodes are in contact with exposed portions of the first nitride-based layer;
wherein the passivation layer is disposed over the second nitride-based semiconductor layer and extends along a sidewall of the first nitride-based layer, and
wherein the passivation layer has a portion to isolate two of the gate electrodes from each other, and the portion fills a region between the two gate electrodes and is located over a top surface of the first nitride-based layer.

16. The method of claim 15, wherein forming a passivation layer comprises:
forming a blanket passivation layer over the first nitride-based layer; and
patterning the blanket passivation layer to remove some portions of the blanket passivation layer such that the openings are formed.

17. The method of claim 15, wherein forming the gate electrodes comprises:
forming a blanket conductive layer over the first nitride-based layer; and
patterning the blanket conductive layer to form the gate electrodes separated from each other.

18. The method of claim 15, wherein the gate electrodes are formed to fill with the openings, respectively.

19. The method of claim 18, wherein the gate electrodes extend from the openings to the outside of the openings.

* * * * *